US008717330B2

(12) United States Patent
Lu et al.

(10) Patent No.: US 8,717,330 B2
(45) Date of Patent: May 6, 2014

(54) FLEXIBLE PROJECTIVE CAPACITIVE TOUCH SENSOR STRUCTURE

(75) Inventors: Chih-Chiang Lu, Taipei County (TW); Bao-Shun Yau, Kaohsiung (TW); Chung-Huang Huang, Hsinchu County (TW)

(73) Assignee: Industrial Technology Research Institute, Hsinchu (TW)

(*) Notice: Subject to any disclaimer, the term of this patent is extended or adjusted under 35 U.S.C. 154(b) by 645 days.

(21) Appl. No.: 12/951,071

(22) Filed: Nov. 22, 2010

(65) Prior Publication Data

US 2012/0127112 A1 May 24, 2012

(51) Int. Cl.
*G06F 3/045* (2006.01)
(52) U.S. Cl.
USPC .......... 345/174; 345/173; 174/254; 178/18.06
(58) Field of Classification Search
USPC .......... 174/254; 156/60; 178/18.06; 345/173, 345/174
See application file for complete search history.

(56) References Cited

U.S. PATENT DOCUMENTS

| 2002/0149572 | A1* | 10/2002 | Schulz et al. | 345/174 |
|---|---|---|---|---|
| 2006/0202970 | A1 | 9/2006 | Lii et al. | |
| 2008/0303782 | A1* | 12/2008 | Grant et al. | 345/156 |
| 2009/0153521 | A1* | 6/2009 | Jiang et al. | 345/174 |
| 2010/0066702 | A1* | 3/2010 | Lee et al. | 345/174 |
| 2010/0117985 | A1 | 5/2010 | Wadia | |
| 2011/0001717 | A1* | 1/2011 | Hayes et al. | 345/173 |
| 2011/0141040 | A1* | 6/2011 | Kang et al. | 345/173 |
| 2011/0193796 | A1* | 8/2011 | Cho et al. | 345/173 |

FOREIGN PATENT DOCUMENTS

| CN | 1502166 | 6/2004 |
|---|---|---|
| CN | 101059736 | 10/2007 |
| CN | 101458600 | 6/2009 |
| CN | 101639580 | 2/2010 |
| CN | 101673001 | 3/2010 |
| TW | 581917 | 4/2004 |
| TW | 200633607 | 9/2006 |
| TW | M359752 | 6/2009 |

OTHER PUBLICATIONS

Hwang et al., "45.3: On-cell Projected Capacitive Type Touch Sensor for NBPC", SID 10 Digest, May 23, 2010, pp. 677-679.
Chris Brown, "24.3L: Late-News Paper: In-Cell Capacitance Touch-Panel with Improved Sensitivity", SID 10 Digest, May 23, 2010, pp. 346-349.

(Continued)

*Primary Examiner* — Alexander S Beck
*Assistant Examiner* — Amen Bogale
(74) *Attorney, Agent, or Firm* — Jianq Chyun IP Office

(57) ABSTRACT

A flexible projective capacitive touch sensor structure includes following elements. A roll of first flexible transparent substrate has sensing unit regions thereon, and each of the sensing unit regions includes at least two first transparent patterned electrodes and at least three second transparent patterned electrodes. Bridging wires respectively stride over the corresponding first transparent patterned electrodes and respectively and electrically bridge the second transparent patterned electrodes located at two sides of each of the first transparent patterned electrodes to form at least one conducting wire. Dielectric pads are disposed between the bridging wires and the first transparent patterned electrodes. First connection wires are connected to the first transparent patterned electrodes and have first electrical connection terminals. Each of the second connection wires is connected to one second transparent patterned electrode of one end of the at least one conducting wire and has one second electrical connection terminal.

30 Claims, 8 Drawing Sheets

(56) References Cited

OTHER PUBLICATIONS

Kung et al., "31.2: Ultra-Thin High-Transparency Projective Capacitive Touch Sensing Film", SID 10 Digest, May 23, 2010, pp. 449-452.
"First Office Action of China counterpart application" issued on Jul. 24, 2013, p. 1-p. 12, in which the listed references were cited.
"Office Action of Taiwan Counterpart Application", issued on Sep. 17, 2013, p. 1-p. 9, in which the listed references (Ref. 1-4) were cited.
"Office Action of China Counterpart Application", issued on Nov. 11, 2013, p. 1-p. 10, in which the listed reference (Ref. 5) was cited.

* cited by examiner

FLEXIBLE PROJECTIVE CAPACITIVE TOUCH SENSOR STRUCTURE

BACKGROUND

1. Field of the Disclosure

The disclosure relates to a touch sensor structure. Particularly, the disclosure relates to a flexible projective capacitive touch sensor structure.

2. Description of Related Art

Display technique is developed towards a trend of a more user-friendly man-machine interface. In the past, panel operations are generally performed through specified mechanical buttons. With development of flat panel displays, touch panels are widely used to replace input devices such as keyboards and mouses, etc., so as to facilitate users to easily operate various information products. Therefore, a touch panel era with easy operation is coming, for example, vehicle touch panels (vehicle navigation), game machines, public information systems (for example, vending machines, automatic teller machines (ATMs), guide systems, etc.), industrial uses, and small electronic products (for example, personal digital assistants (PDAs), e-books), etc. Competition in such field is intense, and major production countries include Japan, Taiwan, the United States, South Korea and China. Almost all of the world's leading manufacturers are actively engaged in such technical domain, and it is expected that the market demand of the touch panels in the next few years may have a significant growth.

As iPhones are worldwide spread, sales of smart phones are rapidly growing, and market potential of hardware equipments and application services of the smart phone is tremendous. Therefore, development of projective capacitive touch panels is explosive, and more and more manufactures devote in development and related production of multi-touch technology. The existing production line applies a conventional glass sheet type equipment and a corresponding fabrication process, and a temperature of pre-heat treatment thereof is relatively high. Moreover, regarding an existing film type equipment and the corresponding fabrication process, a roll type film material is cut into sheet type films for adhesion, and then fabricated into panels under the existing conditions, so that fabrication steps thereof are complicated, and many fabrication steps require manual operations, so that a lot of manpower is required, which leads to a low production efficiency.

According to the fabrication process of the conventional projective capacitive touch panel, the sheet-type units have to be repeatedly loaded to and unloaded from an additional carrier. Each of the sheet-type units requires a batch type equipment, and the required process equipments and processing steps are relatively more. The production line is not fully automated, and the fabrication process is labor-intensive, which results in a slow mass production rate, and a production yield is difficult to be controlled.

SUMMARY OF THE DISCLOSURE

Accordingly, the disclosure is directed to a flexible projective capacitive touch sensor structure, which is a roll of product and has features of easy management and facilitating follow-up processing.

The disclosure is directed to a flexible projective capacitive touch sensor structure, by which fabrication processes can be simplified.

The disclosure is directed to a flexible projective capacitive touch sensor structure, which can be produced through fully automated production.

The disclosure is directed to a flexible projective capacitive touch sensor structure, which has an improved production yield.

The disclosure provides a flexible projective capacitive touch sensor structure including a roll of first flexible transparent substrate, a plurality of bridging wires, a plurality of dielectric pads, a plurality of first connection wires and a plurality of second connection wires. The roll of first flexible transparent substrate has a plurality of sensing unit regions thereon, and each of the sensing unit regions includes at least two first transparent patterned electrodes and at least three second transparent patterned electrodes, and the second transparent patterned electrodes are disposed at two sides of each of the first transparent patterned electrodes. The bridging wires respectively stride over the corresponding first transparent patterned electrodes and respectively and electrically bridge the second transparent patterned electrodes located at two sides of each of the first transparent patterned electrodes, wherein the bridging wires bridge the second transparent patterned electrodes to form at least one conducting wire. The dielectric pads are disposed between the bridging wires and the first transparent patterned electrodes. The first connection wires are connected to the first transparent patterned electrodes and have first electrical connection terminals. Each of the second connection wires is connected to one second transparent patterned electrode of one end of the at least one conducting wire and has one second electrical connection terminal.

The disclosure provides a flexible projective capacitive touch sensor structure including a roll of first flexible transparent substrate, a plurality of bridging wires, a plurality of dielectric pads, a plurality of first connection wires, a plurality of second connection wires and a plurality of transparent substrates. The roll of first flexible transparent substrate has a plurality of sensing unit regions thereon, and each of the sensing unit regions includes at least two first transparent patterned electrodes and at least three second transparent patterned electrodes, and the second transparent patterned electrodes are disposed at two sides of each of the first transparent patterned electrodes. The bridging wires respectively stride over the corresponding first transparent patterned electrodes and respectively and electrically bridge the second transparent patterned electrodes located at two sides of each of the first transparent patterned electrodes, wherein the bridging wires bridge the second transparent patterned electrodes to form at least one conducting wire. The dielectric pads are disposed between the bridging wires and the first transparent patterned electrodes. The first connection wires are connected to the first transparent patterned electrodes and have first electrical connection terminals. Each of the second connection wires is connected to one second transparent patterned electrode of one end of the at least one conducting wire and has one second electrical connection terminal. The transparent substrates cover the corresponding sensing unit regions, the corresponding first connection wires and the corresponding second connection wires.

The disclosure provides a flexible projective capacitive touch sensor structure including a roll of first flexible transparent substrate, a plurality of bridging wires, a plurality of dielectric pads, a plurality of first connection wires, a plurality of second connection wires and a roll of second flexible transparent substrate. The roll of first flexible transparent substrate has a plurality of sensing unit regions thereon, and each of the sensing unit regions includes at least two first transparent patterned electrodes and at least three second transparent patterned electrodes, and the second transparent patterned electrodes are disposed at two sides of each of the first transparent patterned electrodes. The bridging wires respectively stride over the corresponding first transparent patterned electrodes and respectively and electrically bridge the second transparent patterned electrodes located at two sides of each of the first transparent patterned electrodes, wherein the bridging wires bridge the second transparent patterned electrodes to form at least one conducting wire. The dielectric pads are disposed between the bridging wires and the first transparent patterned electrodes. The first connection wires are connected to the first transparent patterned electrodes and have first electrical connection terminals. Each of the second connection wires is connected to one second transparent patterned electrode of one end of the at least one conducting wire and has one second electrical connection terminal. The roll of second flexible transparent substrate covers the roll of first flexible transparent substrate and has a plurality of openings, where the openings expose the first electrical connection terminals and the second electrical connection terminals.

The disclosure provides a flexible projective capacitive touch sensor structure including a roll of first flexible transparent substrate, a plurality of bridging wires, a plurality of dielectric pads, a plurality of first connection wires, a plurality of second connection wires, a roll of second flexible transparent substrate and a plurality of flexible printed circuits. The roll of first flexible transparent substrate has a plurality of sensing unit regions thereon, and each of the sensing unit regions includes at least two first transparent patterned electrodes and at least three second transparent patterned electrodes, and the second transparent patterned electrodes are disposed at two sides of each of the first transparent patterned electrodes. The bridging wires respectively stride over the corresponding first transparent patterned electrodes and respectively and electrically bridge the second transparent patterned electrodes located at two sides of each of the first transparent patterned electrodes, wherein the bridging wires bridge the second transparent patterned electrodes to form at least one conducting wire. The dielectric pads are disposed between the bridging wires and the first transparent patterned electrodes. The first connection wires are connected to the first transparent patterned electrodes and have first electrical connection terminals. Each of the second connection wires is connected to one second transparent patterned electrode of one end of the at least one conducting wire and has one second electrical connection terminal. The roll of second flexible transparent substrate covers the roll of first flexible transparent substrate and has a plurality of openings, where the openings expose the first electrical connection terminals and the second electrical connection terminals. The flexible printed circuits pass through the openings, and are connected to the first electrical connection terminals and the second electrical connection terminals exposed by the openings.

According to the above descriptions, the flexible projective capacitive touch sensor structure of the disclosure is a roll of product, which has features of easy management and facilitating follow-up processing. Therefore, during a fabrication process of the flexible projective capacitive touch sensor structure of the disclosure, a roll to roll (R2R) process can be used to implement a fully automated production, which has following features: usage of a carrier is unnecessary, the fabrication processes are simplified, productivity and unit investment returns are improved, manpower operating variables are reduced, and the production yield is improved, etc.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
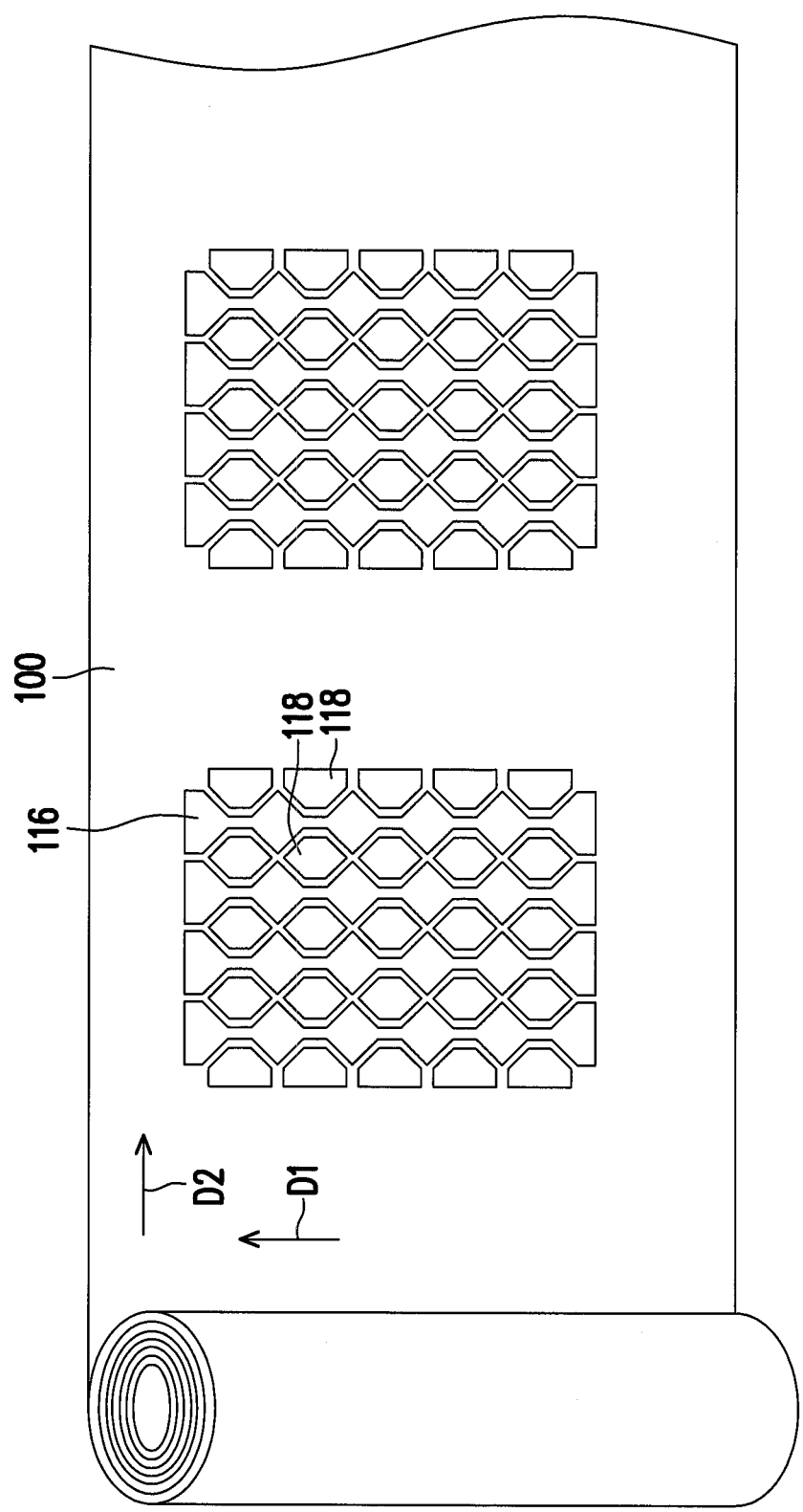
FIG. 1 is a top view of first transparent patterned electrodes and second transparent patterned electrodes of a flexible projective capacitive touch sensor structure according to a first exemplary embodiment of the disclosure.
Figure 2:
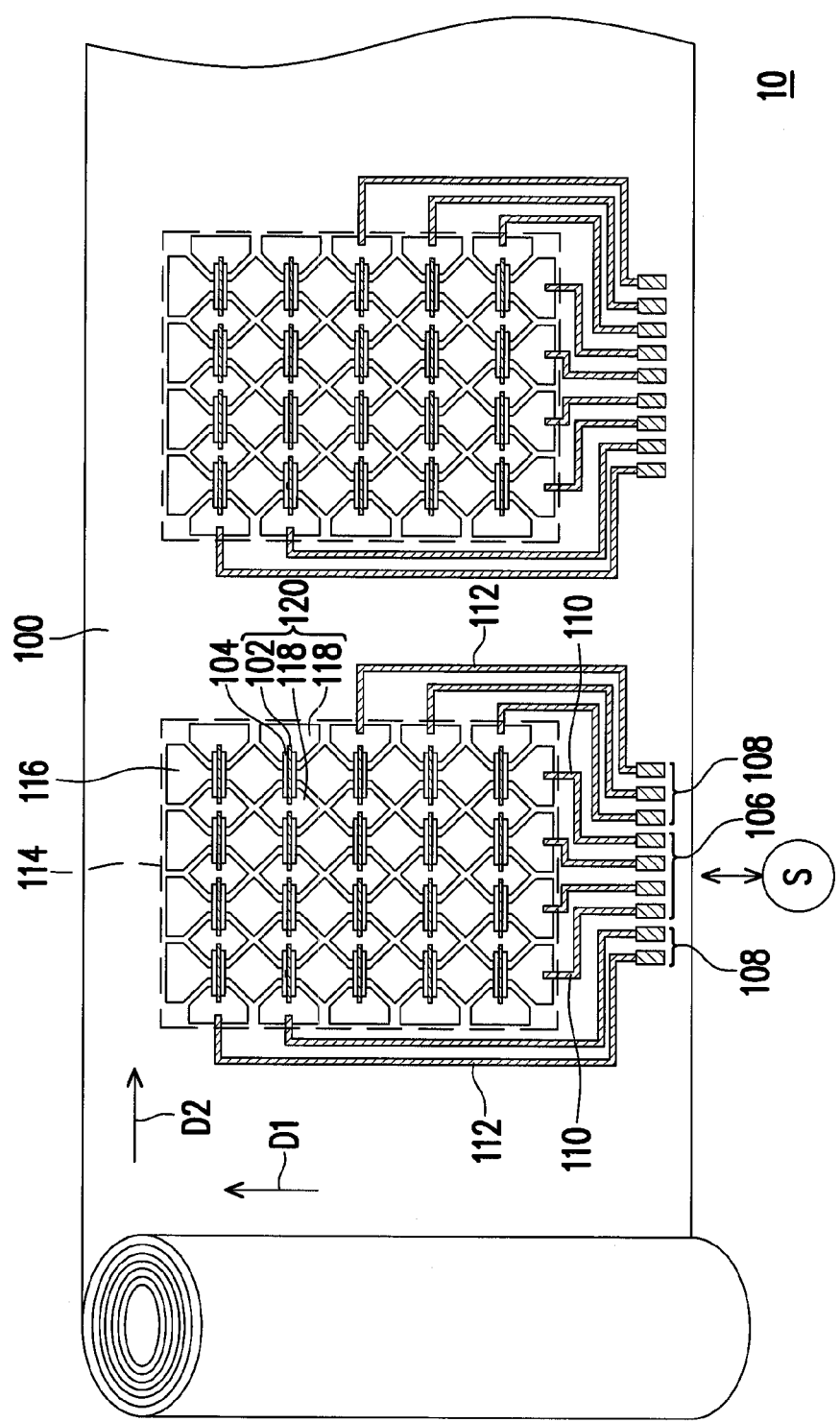
FIG. 2 is a top view of the flexible projective capacitive touch sensor structure according to a first exemplary embodiment of the disclosure.
Figure 3:
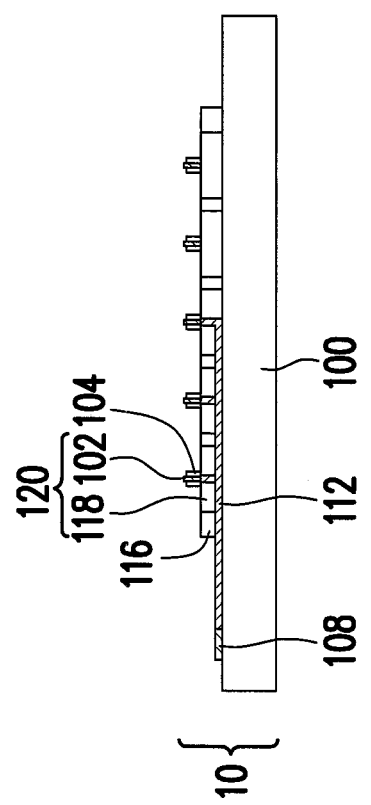
FIG. 3 is a side view of FIG. 2 viewing from a right side.

FIG. 1 is a top view of first transparent patterned electrodes and second transparent patterned electrodes of a flexible projective capacitive touch sensor structure according to a first exemplary embodiment of the disclosure. FIG. 2 is a top view of the flexible projective capacitive touch sensor structure according to the first exemplary embodiment of the disclosure. FIG. 3 is a side view of FIG. 2 viewing from a right side.

Referring to FIG. 1 to FIG. 3, the flexible projective capacitive touch sensor structure 10 includes a roll of first flexible transparent substrate 100, a plurality of bridging wires 102, a plurality of dielectric pads 104, a plurality of first connection wires 110 and a plurality of second connection wires 112. A material of the roll of first flexible transparent substrate 100 is, for example, polyethylene terephthalate, polycarbonate or flexible glass.

The roll of first flexible transparent substrate 100 has a plurality of sensing unit regions 114 thereon, and each of the sensing unit regions 114 includes at least two first transparent patterned electrodes 116 and at least three second transparent patterned electrodes 118, and the second transparent patterned electrodes 118 are disposed at two sides of each of the first transparent patterned electrodes 116. One sensing unit region 114 can be used to form a flexible projective capacitive touch sensor. In the present exemplary embodiments, the first transparent patterned electrodes 116 are, for example, extended along a direction D1, and the first transparent patterned electrodes 116 are mutually parallel, though the disclosure is not limited thereto.

Materials of the first transparent patterned electrodes 116 and the second transparent patterned electrodes 118 are, for example, respectively transparent conductive oxide, an organic transparent conductive material, nano metal or carbon nanotube, where the transparent conductive oxide is, for example, indium tin oxide (ITO) or indium zinc oxide (IZO), and the organic transparent conductive material is, for example, poly (3,4-ethylenedioxythiophene):poly (styrene-sulfonate) (PEDOT:PPS). Moreover, the first transparent patterned electrode 116 and the second transparent patterned electrode 118 can be respectively a single-layer structure or a multi-layer structure. When the first transparent patterned electrode 116 and/or the second transparent patterned electrode 118 are respectively the multi-layer structure, the multi-layer structure of the first transparent patterned electrode 116 and/or the second transparent patterned electrode 118 is, for example, a stack combination of transparent metal oxide layers and a metal layer, which can be a stack structure of transparent metal oxide layer/metal layer/transparent metal oxide layer, for example, ITO/Ag/ITO.

The bridging wires 102 respectively stride over the corresponding first transparent patterned electrodes 116 and respectively and electrically bridge the second transparent patterned electrodes 118 located at two sides of each of the first transparent patterned electrodes 116. For example, in the present exemplary embodiment, the bridging wires 102 bridge the second transparent patterned electrodes 118 to form at least one conducting wire 120 extending along a second direction D2. The conducting wires 120 are parallel to each other, and the second direction D2 is intersected to the first direction D1, so that the conducting wires 120 and the first transparent patterned electrodes 116 may form a matrix structure, though the disclosure is not limited thereto. In other embodiments, the bridging wires 102 can also bridge the second transparent patterned electrodes 118 to form a single wire 120 extending along the second direction D2. A material of the bridging wires 102 is, for example, a conductive silver paste or a metal material, where the metal material can be a copper-containing metal material, or a multi-layer material of molybdenum/aluminium/molybdenum, etc. Furthermore, the sensing unit regions 114 can be disposed repeatedly along the first direction D1 and/or the second direction D2.

The dielectric pads 104 are disposed between the bridging wires 102 and the first transparent patterned electrodes 116 for isolating the corresponding bridging wires 102 and the first transparent patterned electrodes 116, and the bridging wires 102, the dielectric pads 104 and the first transparent patterned electrodes 116 may form sensing capacitors. A material of the dielectric pads 104 is, for example, a dielectric material such as resin, for example, photosensitive resin or thermosetting resin.

The first connection wires 110 are connected to the first transparent patterned electrodes 116 and have first electrical connection terminals 106. A material of the first connection wires 110 is, for example, a conductive silver paste or a metal material, where the metal material can be a copper-containing metal material, or a multi-layer material of molybdenum/ aluminium/molybdenum, etc. The first electrical connection terminals 106 may transmit an external signal S to the first transparent patterned electrodes 116 through the first connection wires 110. Moreover, those skilled in the art can design and adjust the external signal S transmitted to the first transparent patterned electrodes 116 by themselves. The first connection wires 110 and the corresponding first electrical connection terminals 106 can be integrally formed or independently formed, for example.

Each of the second connection wires 112 is connected to one second transparent patterned electrode 118 of one end of one corresponding conducting wire 120 and has one second electrical connection terminal 108. A material of the second connection wires 112 is, for example, a conductive silver paste or a metal material, where the metal material can be a copper-containing metal material, or a multi-layer material of molybdenum/aluminium/molybdenum, etc. The second electrical connection terminals 108 may transmit the external signal S to the second transparent patterned electrodes 118 through the second connection wires 112. Moreover, those skilled in the art can design and adjust the external signal S transmitted to the second transparent patterned electrodes 118 by themselves. The second connection wires 112 and the corresponding second electrical connection terminals 108 can be integrally formed or independently formed, for example.

According to the above descriptions, it is known that the flexible projective capacitive touch sensor structure 10 is a roll of product, and the flexible projective capacitive touch sensor structure 10 can be extended along a machine direction (MD) of the product substrate and can be rolled up to be a roll, so that it has features of easy management and facilitating follow-up processing.

Therefore, during a fabrication process of the flexible projective capacitive touch sensor structure 10 of the present exemplary embodiment, a roll to roll (R2R) process can be used to implement a fully automated production, which has following features: usage of a carrier is unnecessary, the fabrication processes are simplified, productivity and unit investment returns are improved, manpower operating variables are reduced, and the production yield is improved, etc.

Figure 4:
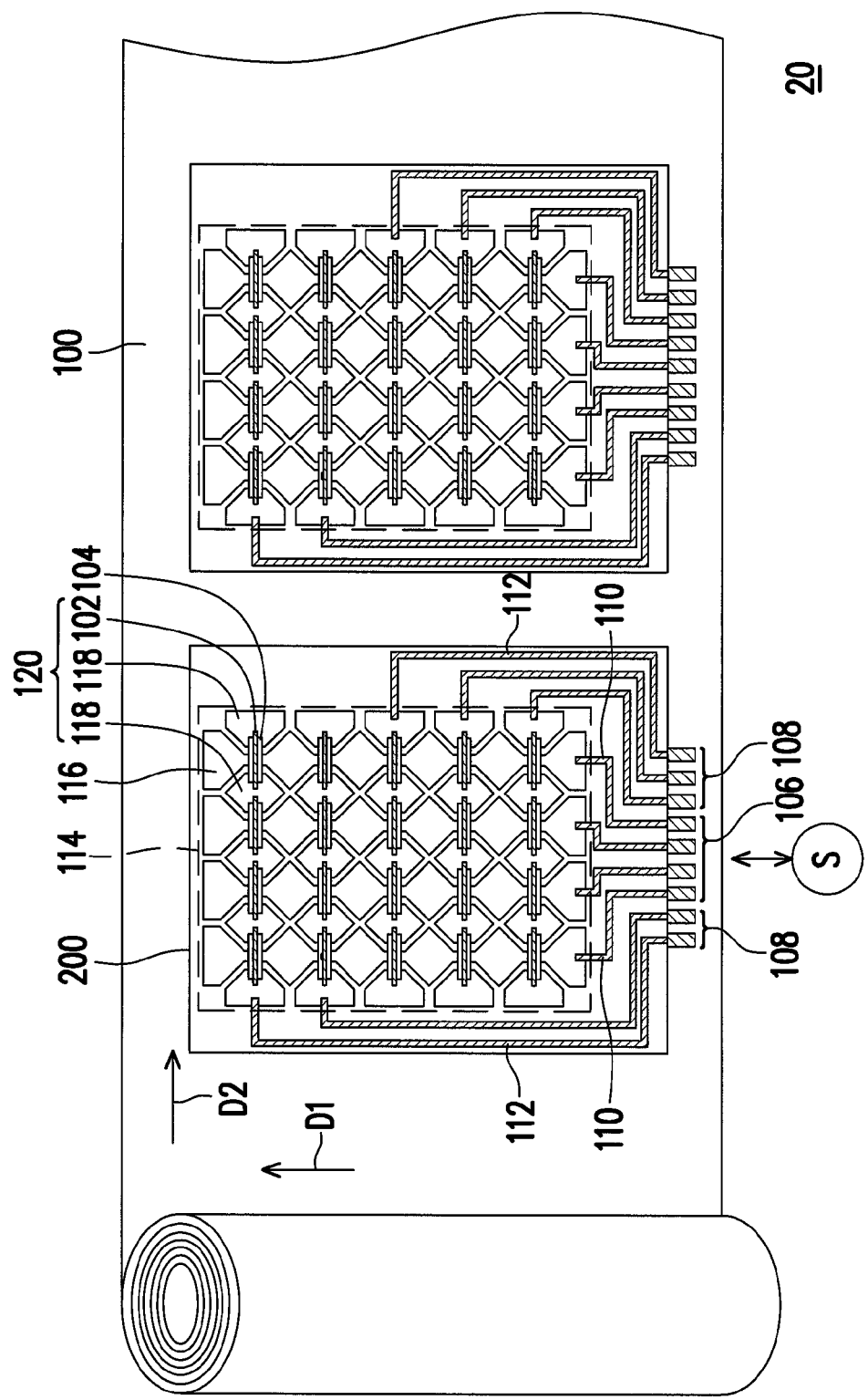
FIG. 4 is a top view of a flexible projective capacitive touch sensor structure according to a second exemplary embodiment of the disclosure.
Figure 5:
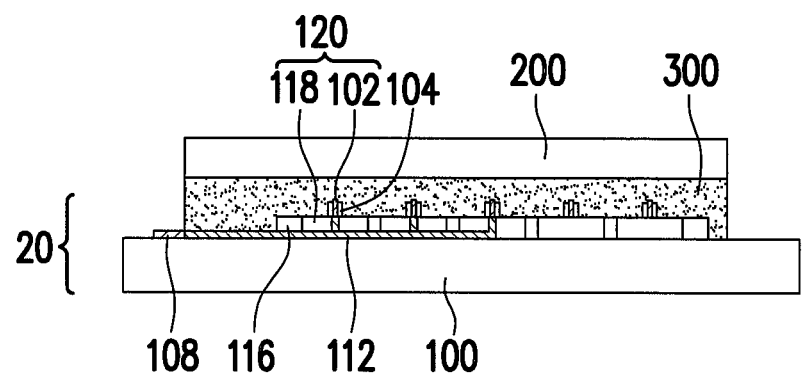
FIG. 5 is a side view of FIG. 4 viewing from a right side.

FIG. 4 is a top view of a flexible projective capacitive touch sensor structure according to a second exemplary embodiment of the disclosure. FIG. 5 is a side view of FIG. 4 viewing from a right side.

Referring to FIG. 2 to FIG. 5, a difference between the flexible projective capacitive touch sensor structure 20 of the second exemplary embodiment and the flexible projective capacitive touch sensor structure 10 of the first exemplary embodiment is that the flexible projective capacitive touch sensor structure 20 further includes transparent substrates 200. Moreover, the flexible projective capacitive touch sensor structure 20 may further include an adhesive layer 300. Materials, configuration manners and functions of the other components in the flexible projective capacitive touch sensor structure 20 of the second exemplary embodiment are similar to that in the flexible projective capacitive touch sensor structure 10 of the first exemplary embodiment, so that these components are denoted by the same referential numerals, and descriptions thereof are not repeated.

Referring to FIG. 4 and FIG. 5, the transparent substrates 200 cover the corresponding sensing unit regions 114, the corresponding first connection wires 110 and the corresponding second connection wires 112 to serve as a cover layer of the flexible projective capacitive touch sensors. A material of the transparent substrates 200 is, for example, polyethylene terephthalate, polycarbonate or flexible glass.

The adhesive layer 300 is disposed between the roll of first flexible transparent substrate 100 and the transparent substrate 200 for adhering the roll of first flexible transparent substrate 100 and the transparent substrate 200. A material of the adhesive layer 300 is, for example, a water adhesive or an optical adhesive. The adhesive layer 300 can be completely or partially filled in a space between the roll of first flexible transparent substrate 100 and the transparent substrate 200, for example. The adhesive layer 300 can be various shapes, such as a frame shape.

In the present exemplary embodiment, the transparent substrate 200 of the flexible projective capacitive touch sensor structure 20 may expose the first electrical connection terminals 106 and the second electrical connection terminals 108 coupled to the external signal S, though the disclosure is not limited thereto. In other embodiments, the transparent substrate 200 of the flexible projective capacitive touch sensor structure 20 may cover the first electrical connection terminals 106 and the second electrical connection terminals 108, in this case, the external signal S can be coupled to the first electrical connection terminals 106 and the second electrical connection terminals 108 through a space between the roll of first flexible transparent substrate 100 and the transparent substrate 200. The first electrical connection terminals 106 can transmit the external signal S to the first transparent patterned electrodes 116 through the first connection wires 110. Moreover, the second electrical connection terminals 108 can transmit the external signal S to the second transparent patterned electrodes 118 through the second connection wires 112.

According to the above descriptions, the flexible projective capacitive touch sensor structure 20 is a roll of product, which has features of easy management and facilitating follow-up processing, and the roll to roll (R2R) process can be used to implement a fully automated production.

Figure 6:
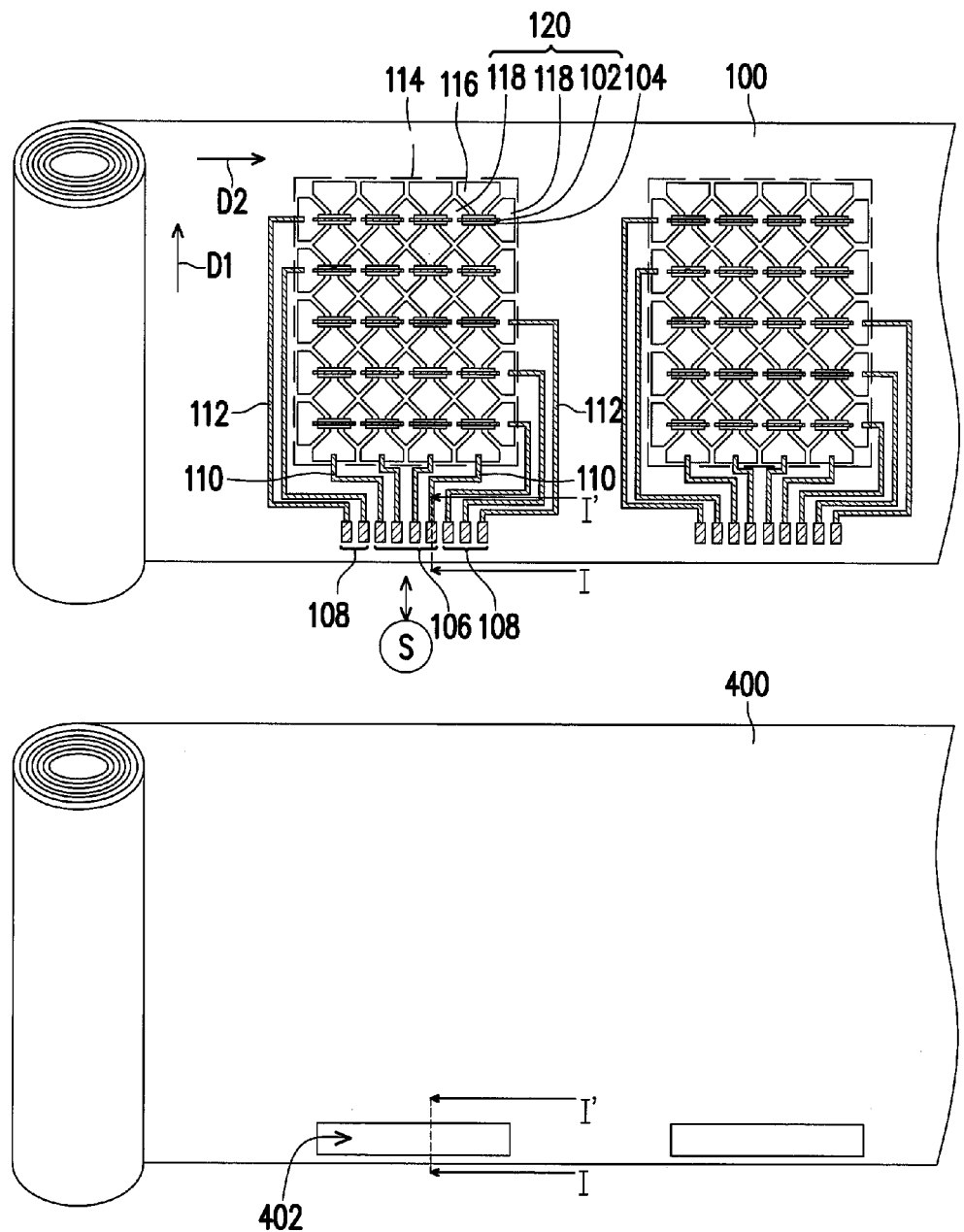
FIG. 6 is a top view of a flexible projective capacitive touch sensor structure before lamination according to a third exemplary embodiment of the disclosure.
Figure 7:
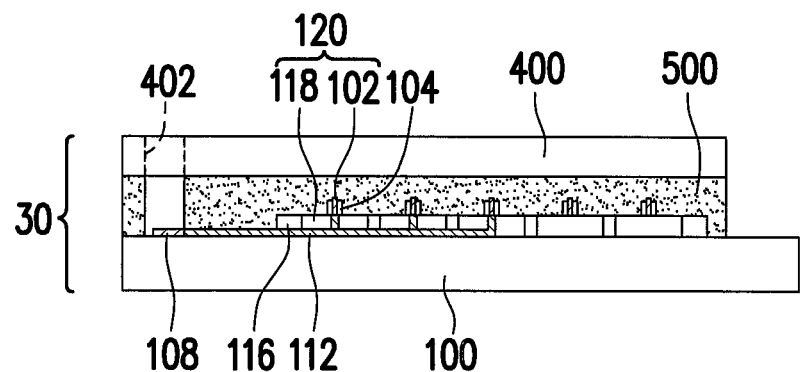
FIG. 7 is a side view of the flexible projective capacitive touch sensor structure after lamination viewing from a right side of FIG. 6.
Figure 8:
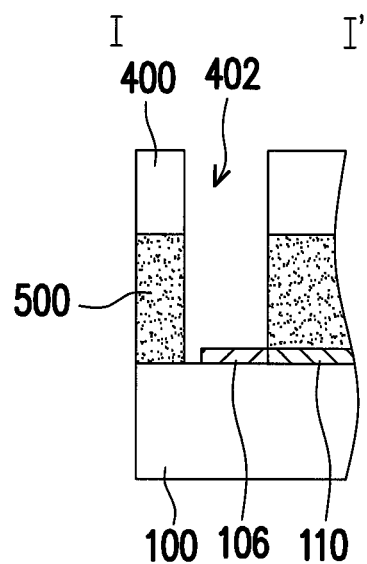
FIG. 8 is a cross-sectional view of the flexible projective capacitive touch sensor structure after lamination viewing along a cross-sectional line I-I' of FIG. 6.

FIG. 6 is a top view of a flexible projective capacitive touch sensor structure before lamination according to a third exemplary embodiment of the disclosure. FIG. 7 is a side view of the flexible projective capacitive touch sensor structure after lamination viewing from a right side of FIG. 6. FIG. 8 is a cross-sectional view of the flexible projective capacitive touch sensor structure after lamination viewing along a cross-sectional line I-I' of FIG. 6.

Referring to FIG. 2 to FIG. 3 and FIG. 6 to FIG. 8, a difference between the flexible projective capacitive touch sensor structure 30 of the third exemplary embodiment and the flexible projective capacitive touch sensor structure 10 of the first exemplary embodiment is that the flexible projective capacitive touch sensor structure 30 further includes a roll of second flexible transparent substrate 400. Moreover, the flexible projective capacitive touch sensor structure 30 may further include an adhesive layer 500. Materials, configuration manners and functions of the other components in the flexible projective capacitive touch sensor structure 30 of the third exemplary embodiment are similar to that in the flexible projective capacitive touch sensor structure 10 of the first exemplary embodiment, so that these components are denoted by the same referential numerals, and descriptions thereof are not repeated.

The roll of second flexible transparent substrate 400 covers the roll of first flexible transparent substrate 100 and has a plurality of openings 402, where the openings 402 expose the first electrical connection terminals 106 and the second electrical connection terminals 108. The roll of second flexible transparent substrate 400 can serve as a cover layer of the flexible projective capacitive touch sensors. A material of the roll of second flexible transparent substrate 400 is, for example, polyethylene terephthalate, polycarbonate or flexible glass.

The adhesive layer 500 is disposed between the roll of first flexible transparent substrate 100 and the roll of second flexible transparent substrate 400 for adhering the roll of first flexible transparent substrate 100 and the roll of second flexible transparent substrate 400. A material of the adhesive layer 500 is, for example, a water adhesive or optical an adhesive.

In the present exemplary embodiment, the external signal S can be coupled to the first electrical connection terminals 106 and the second electrical connection terminals 108 through the openings 402, though the disclosure is not limited thereto. The first electrical connection terminals 106 can transmit the external signal S to the first transparent patterned electrodes 116 through the first connection wires 110. Moreover, the second electrical connection terminals 108 can transmit the external signal S to the second transparent patterned electrodes 118 through the second connection wires 112.

According to the above descriptions, the flexible projective capacitive touch sensor structure 30 is a roll of product, which has features of easy management and facilitating follow-up processing, and the roll to roll (R2R) process can be used to implement a fully automated production.

Figure 9:
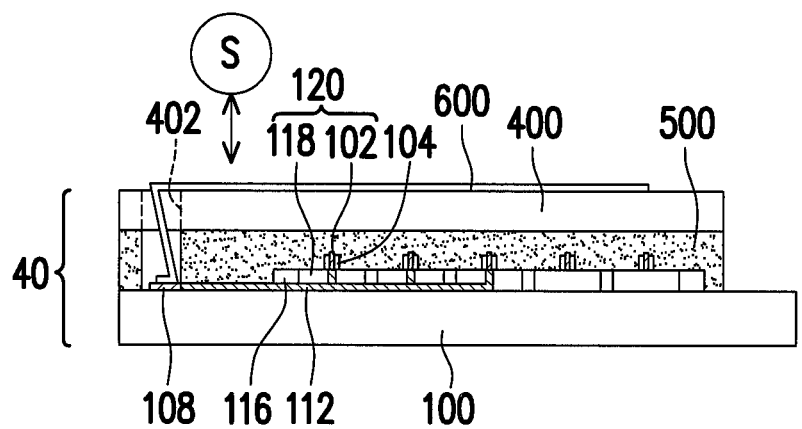
FIG. 9 is a side view of a flexible projective capacitive touch sensor structure after lamination viewing from a right side of FIG. 6 according to a fourth exemplary embodiment of the disclosure.
Figure 10:
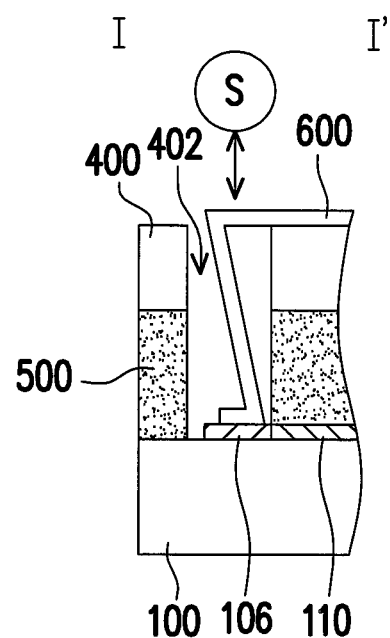
FIG. 10 is a cross-sectional view of the flexible projective capacitive touch sensor structure after lamination viewing along a cross-sectional line I-I' of FIG. 6 according to the fourth exemplary embodiment of the disclosure.

FIG. 9 is a side view of a flexible projective capacitive touch sensor structure after lamination viewing from a right side of FIG. 6 according to a fourth exemplary embodiment of the disclosure. FIG. 10 is a cross-sectional view of the flexible projective capacitive touch sensor structure after lamination viewing along a cross-sectional line I-I' of FIG. 6 according to the fourth exemplary embodiment of the disclosure.

Referring to FIG. 6 to FIG. 10, a difference between the flexible projective capacitive touch sensor structure 40 of the fourth exemplary embodiment and the flexible projective capacitive touch sensor structure 30 of the third exemplary embodiment is that the flexible projective capacitive touch sensor structure 40 further includes a plurality of flexible printed circuits (FPCs) 600. Materials, configuration manners and functions of the other components in the flexible projective capacitive touch sensor structure 40 of the fourth exemplary embodiment are similar to that in the flexible projective capacitive touch sensor structure 30 of the third exemplary embodiment, so that these components are denoted by the same referential numerals, and descriptions thereof are not repeated.

The flexible FPCs 600 pass through the openings 402, and are connected to the first electrical connection terminals 106 and the second electrical connection terminals 108 exposed by the openings 402. Therefore, in the present exemplary embodiment, the flexible FPCs 600 can transmit the external signal S to the first transparent patterned electrodes 116 through the first electrical connection terminals 106 and the first connection wires 110. Moreover, the flexible FPCs 600 can transmit the external signal S to the second transparent patterned electrodes 118 through the second electrical connection terminals 108 and the second connection wires 112.

According to the above descriptions, the flexible projective capacitive touch sensor structure 40 is a roll of product, which has features of easy management and facilitating follow-up processing, and the roll to roll (R2R) process can be used to implement a fully automated production.

The flexible projective capacitive touch sensor structures 10, 20, 30 and 40 of the above exemplary embodiments can be fabricated through a fully automated continuous R2R process. Taking a fabrication process of the flexible projective capacitive touch sensor structure 10 as an example, the first transparent patterned electrodes 116 and the second transparent patterned electrodes 118 can be respectively fabricated on the roll of first flexible transparent substrate 100 through the R2R process. Then, the R2R process is used to continuously print the dielectric pads 104, the first electrical connection terminals 106, the second electrical connection terminals 108, the first connection wires 110 and the second connection wires 112, and then a gravure offset printing process is used to continuously print the bridging wires 102, so as to fabricate the roll of flexible projective capacitive touch sensor structure 10, though the disclosure is not limited thereto. In other embodiments, the bridging wires 102, the first electrical connection terminals 106, the second electrical connection terminals 108, the first connection wires 110 and the second connection wires 112 in the flexible projective capacitive touch sensor structure 10 can also be fabricated through a metal vacuum deposition process and a patterning process.

In summary, the aforementioned exemplary embodiments have at least the following features:

1. The flexible projective capacitive touch sensor structures provided by the aforementioned exemplary embodiments are roll of products, which have advantages of easy management and facilitating follow-up processing.
2. Fabrication processes can be simplified according to the design of the flexible projective capacitive touch sensor structures provided by the aforementioned exemplary embodiments.
3. A fully automated production of the flexible projective capacitive touch sensor structures provided by the aforementioned exemplary embodiments can be implemented.
4. Production yield of the flexible projective capacitive touch sensor structures provided by the aforementioned exemplary embodiments can be improved.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A flexible projective capacitive touch sensor structure, comprising:
    a roll of first flexible transparent substrate, having a plurality of sensing unit regions thereon, and each of the sensing unit regions comprising at least two first transparent patterned electrodes and at least three second transparent patterned electrodes, wherein the second transparent patterned electrodes are disposed at two sides of each of the first transparent patterned electrodes;
    a plurality of bridging wires, respectively striding over the corresponding first transparent patterned electrodes, and respectively and electrically bridging the second transparent patterned electrodes located at two sides of each of the first transparent patterned electrodes, wherein the bridging wires bridge the second transparent patterned electrodes to form at least one conducting wire;
    a plurality of dielectric pads, disposed between the bridging wires and the first transparent patterned electrodes;
    a plurality of first connection wires, connected to the first transparent patterned electrodes and having first electrical connection terminals;
    a plurality of second connection wires, each of the second connection wires connected to one second transparent patterned electrode of one end of the at least one conducting wire and having one second electrical connection terminal; and
    a roll of second flexible transparent substrate, covering the roll of first flexible transparent substrate and having a plurality of openings, wherein the openings expose the first electrical connection terminals and the second electrical connection terminals,
    wherein the sensing unit regions are separated from each other by a portion of the roll of first flexible transparent substrate.

2. The flexible projective capacitive touch sensor structure as claimed in claim 1, wherein a material of the roll of first flexible transparent substrate comprises polyethylene terephthalate, polycarbonate or flexible glass.

3. The flexible projective capacitive touch sensor structure as claimed in claim 1, wherein materials of the first transparent patterned electrodes and the second transparent patterned electrodes respectively comprise transparent conductive oxide, an organic transparent conductive material, nano metal or carbon nanotube.

4. The flexible projective capacitive touch sensor structure as claimed in claim 1, wherein the first transparent patterned electrodes and the second transparent patterned electrodes respectively comprise single-layer structures or multi-layer structures.

5. The flexible projective capacitive touch sensor structure as claimed in claim 1, wherein a material of the bridging wires comprises a conductive silver paste or a metal material.

6. The flexible projective capacitive touch sensor structure as claimed in claim 1, wherein materials of the first connection wires and the second connection wires respectively comprise a conductive silver paste or a metal material.

7. A flexible projective capacitive touch sensor structure, comprising:
    a roll of first flexible transparent substrate, having a plurality of sensing unit regions thereon, and each of the sensing unit regions comprising at least two first transparent patterned electrodes and at least three second transparent patterned electrodes, wherein the second transparent patterned electrodes are disposed at two sides of each of the first transparent patterned electrodes;
    a plurality of bridging wires, respectively striding over the corresponding first transparent patterned electrodes, and respectively and electrically bridging the second transparent patterned electrodes located at two sides of each of the first transparent patterned electrodes, wherein the bridging wires bridge the second transparent patterned electrodes to form at least one conducting wire;
    a plurality of dielectric pads, disposed between the bridging wires and the first transparent patterned electrodes;
    a plurality of first connection wires, connected to the first transparent patterned electrodes and having first electrical connection terminals;
    a plurality of second connection wires, each of the second connection wires connected to one second transparent patterned electrode at one end of the at least one conducting wire and having one second electrical connection terminal;
    a plurality of transparent substrates, covering the corresponding sensing unit regions, the corresponding first connection wires and the corresponding second connection wires; and
    a roll of second flexible transparent substrate, covering the roll of first flexible transparent substrate and having a plurality of openings, wherein the openings expose the first electrical connection terminals and the second electrical connection terminals,
    wherein the sensing unit regions are separated from each other by a portion of the roll of first flexible transparent substrate.

8. The flexible projective capacitive touch sensor structure as claimed in claim 7, wherein a material of the roll of first flexible transparent substrate comprises polyethylene terephthalate, polycarbonate or flexible glass.

9. The flexible projective capacitive touch sensor structure as claimed in claim 7, wherein materials of the first transparent patterned electrodes and the second transparent patterned electrodes respectively comprise transparent conductive oxide, an organic transparent conductive material, nano metal or carbon nanotube.

10. The flexible projective capacitive touch sensor structure as claimed in claim 7, wherein the first transparent patterned electrodes and the second transparent patterned electrodes respectively comprise single-layer structures or multi-layer structures.

11. The flexible projective capacitive touch sensor structure as claimed in claim 7, wherein a material of the bridging wires comprises a conductive silver paste or a metal material.

12. The flexible projective capacitive touch sensor structure as claimed in claim 7, wherein materials of the first connection wires and the second connection wires respectively comprise a conductive silver paste or a metal material.

13. The flexible projective capacitive touch sensor structure as claimed in claim 7, wherein a material of the transparent substrates comprises polyethylene terephthalate, polycarbonate or flexible glass.

14. The flexible projective capacitive touch sensor structure as claimed in claim 7, further comprising an adhesive layer disposed between the roll of first flexible transparent substrate and the transparent substrates.

15. The flexible projective capacitive touch sensor structure as claimed in claim 7, wherein the transparent substrates cover the first electrical connection terminals and the second electrical connection terminals.

16. The flexible projective capacitive touch sensor structure as claimed in claim 7, wherein the transparent substrates expose the first electrical connection terminals and the second electrical connection terminals.

17. A flexible projective capacitive touch sensor structure, comprising:
  a roll of first flexible transparent substrate, having a plurality of sensing unit regions thereon, and each of the sensing unit regions comprising at least two first transparent patterned electrodes and at least three second transparent patterned electrodes, wherein the second transparent patterned electrodes are disposed at two sides of each of the first transparent patterned electrodes;
  a plurality of bridging wires, respectively striding over the corresponding first transparent patterned electrodes, and respectively and electrically bridging the second transparent patterned electrodes located at two sides of each of the first transparent patterned electrodes, wherein the bridging wires bridge the second transparent patterned electrodes to form at least one conducting wire;
  a plurality of dielectric pads, disposed between the bridging wires and the first transparent patterned electrodes;
  a plurality of first connection wires, connected to the first transparent patterned electrodes and having first electrical connection terminals;
  a plurality of second connection wires, each of the second connection wires connected to one second transparent patterned electrode at one end of the at least one conducting wire and having one second electrical connection terminal; and
  a roll of second flexible transparent substrate, covering the roll of first flexible transparent substrate and having a plurality of openings, wherein the openings expose the first electrical connection terminals and the second electrical connection terminals,
  wherein the sensing unit regions are separated from each other by a portion of the roll of first flexible transparent substrate.

18. The flexible projective capacitive touch sensor structure as claimed in claim 17, wherein materials of the roll of first flexible transparent substrate and the roll of second flexible transparent substrate respectively comprise polyethylene terephthalate, polycarbonate or flexible glass.

19. The flexible projective capacitive touch sensor structure as claimed in claim 17, wherein materials of the first transparent patterned electrodes and the second transparent patterned electrodes respectively comprise transparent conductive oxide, an organic transparent conductive material, nano metal or carbon nanotube.

20. The flexible projective capacitive touch sensor structure as claimed in claim 17, wherein the first transparent patterned electrodes and the second transparent patterned electrodes respectively comprise single-layer structures or multi-layer structures.

21. The flexible projective capacitive touch sensor structure as claimed in claim 17, wherein a material of the bridging wires comprises a conductive silver paste or a metal material.

22. The flexible projective capacitive touch sensor structure as claimed in claim 17, wherein materials of the first connection wires and the second connection wires respectively comprise a conductive silver paste or a metal material.

23. The flexible projective capacitive touch sensor structure as claimed in claim 17, further comprising an adhesive layer disposed between the roll of first flexible transparent substrate and the roll of second flexible transparent substrate.

24. A flexible projective capacitive touch sensor structure, comprising:
  a roll of first flexible transparent substrate, having a plurality of sensing unit regions thereon, and each of the sensing unit regions comprising at least two first transparent patterned electrodes and at least three second transparent patterned electrodes, wherein the second transparent patterned electrodes are disposed at two sides of each of the first transparent patterned electrodes;
  a plurality of bridging wires, respectively striding over the corresponding first transparent patterned electrodes, and respectively and electrically bridging the second transparent patterned electrodes located at two sides of each of the first transparent patterned electrodes, wherein the bridging wires bridge the second transparent patterned electrodes to form at least one conducting wire;
  a plurality of dielectric pads, disposed between the bridging wires and the first transparent patterned electrodes;
  a plurality of first connection wires, connected to the first transparent patterned electrodes and having first electrical connection terminals;
  a plurality of second connection wires, each of the second connection wires connected to one second transparent patterned electrode at one end of the at least one conducting wire and having one second electrical connection terminal;
  a roll of second flexible transparent substrate, covering the roll of first flexible transparent substrate and having a plurality of openings, wherein the openings expose the first electrical connection terminals and the second electrical connection terminals; and
  a plurality of flexible printed circuits, passing through the openings, and connected to the first electrical connection terminals and the second electrical connection terminals exposed by the openings,
wherein the sensing unit regions are separated from each other by a portion of the roll of first flexible transparent substrate.

25. The flexible projective capacitive touch sensor structure as claimed in claim 24, wherein materials of the roll of first flexible transparent substrate and the roll of second flexible transparent substrate respectively comprise polyethylene terephthalate, polycarbonate or flexible glass.

26. The flexible projective capacitive touch sensor structure as claimed in claim 24, wherein materials of the first transparent patterned electrodes and the second transparent patterned electrodes respectively comprise transparent conductive oxide, an organic transparent conductive material, nano metal or carbon nanotube.

27. The flexible projective capacitive touch sensor structure as claimed in claim 24, wherein the first transparent patterned electrodes and the second transparent patterned electrodes respectively comprise single-layer structures or multi-layer structures.

28. The flexible projective capacitive touch sensor structure as claimed in claim 24, wherein a material of the bridging wires comprises a conductive silver paste or a metal material.

29. The flexible projective capacitive touch sensor structure as claimed in claim 24, wherein materials of the first connection wires and the second connection wires respectively comprise a conductive silver paste or a metal material.

30. The flexible projective capacitive touch sensor structure as claimed in claim 24, further comprising an adhesive layer disposed between the roll of first flexible transparent substrate and the roll of second flexible transparent substrate.

* * * * *